(12) United States Patent
Sakamoto et al.

(10) Patent No.: US 8,351,163 B2
(45) Date of Patent: Jan. 8, 2013

(54) TUNNELING MAGNETORESISTANCE READ HEAD HAVING A COFE INTERFACE LAYER AND METHODS FOR PRODUCING THE SAME

(75) Inventors: Koji Sakamoto, Odawara (JP); Koichi Nishioka, Hiratsuka (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 244 days.

(21) Appl. No.: 12/948,072

(22) Filed: Nov. 17, 2010

(65) Prior Publication Data

US 2011/0141613 A1   Jun. 16, 2011

(30) Foreign Application Priority Data

Dec. 10, 2009   (JP) ................................. 2009-280406

(51) Int. Cl.
*G11B 5/39* (2006.01)

(52) U.S. Cl. ................. 360/324.11; 29/603.08

(58) Field of Classification Search ............... 360/324.2, 360/324.11; 29/603.08
See application file for complete search history.

(56) References Cited

U.S. PATENT DOCUMENTS

| | | | |
|---|---|---|---|
| 6,038,107 A | 3/2000 | Pinarbasi | |
| 6,052,263 A | 4/2000 | Gill | |
| 7,001,680 B2 * | 2/2006 | Gill | 428/811.1 |
| 7,280,029 B2 | 10/2007 | Mori et al. | |
| 7,715,153 B2 | 5/2010 | Mizuno et al. | |
| 8,081,404 B2 * | 12/2011 | Ibusuki et al. | 360/324.12 |
| 8,139,325 B2 * | 3/2012 | Tsunekawa et al. | 360/324.2 |
| 2003/0011947 A1 | 1/2003 | Saito et al. | |
| 2007/0230067 A1 * | 10/2007 | Jogo et al. | 360/324.1 |
| 2007/0253122 A1 * | 11/2007 | Fukuzawa et al. | 360/324.11 |
| 2009/0046397 A1 * | 2/2009 | Sun et al. | 360/324.11 |

FOREIGN PATENT DOCUMENTS

| | | |
|---|---|---|
| JP | 11-191207 A | 7/1999 |
| JP | 2000-067418 A | 3/2000 |
| JP | 2001-143223 A | 5/2001 |
| JP | 2003-324225 A | 11/2003 |
| JP | 2004-266284 A | 9/2004 |
| JP | 2006-080144 A | 3/2006 |

* cited by examiner

*Primary Examiner* — Angel A. Castro
(74) *Attorney, Agent, or Firm* — Zilka-Kotab, PC (57) ABSTRACT

According to one embodiment, a method for producing a Tunneling Magnetoresistance (TMR) read head includes forming a fixed layer, forming an insulating barrier layer above the fixed layer, forming a free layer above the insulating barrier layer, and annealing the free layer, the fixed layer, and the insulating barrier layer. The fixed layer includes a first ferromagnetic layer having a $Co_xFe$ ($0 \leq x \leq 15$) interface layer and a Co-based amorphous metallic layer between the $Co_xFe$ interface layer and the insulating barrier layer, an antiparallel coupling layer below the first ferromagnetic layer, and a second ferromagnetic layer below the antiparallel coupling layer. In another embodiment, a TMR read head includes the layers described above, and may be included in a magnetic data storage system.

14 Claims, 10 Drawing Sheets

TUNNELING MAGNETORESISTANCE READ HEAD HAVING A COFE INTERFACE LAYER AND METHODS FOR PRODUCING THE SAME

RELATED APPLICATIONS

The present application claims priority to a Japanese Patent Application filed Dec. 10, 2009 under Appl. No. 2009-280406, which is incorporated herein by reference.

FIELD OF THE INVENTION

The present invention relates to a method for producing a tunneling magnetoresistive (TMR) read head and to a TMR layered structure, and more particularly the invention relates to a fixed layer structure in a TMR layered structure.

BACKGROUND

Hard disk drives (HDD) are provided with a magnetic recording disk and a magnetic head, and data on the magnetic recording disk is read and written by means of the magnetic head. A magnetic head in an HDD comprises a write head for recording data onto the magnetic recording disk as magnetization signals, and a read head for reading the signals which are recorded as magnetization signals on the magnetic recording disk. The read head comprises a magnetoresistive layered structure formed from a plurality of magnetic thin films and non-magnetic thin films. The read head reads the signals using the magnetoresistive effect and therefore it is referred to as a "magnetoresistive head."

There are several kinds of layer structures for magnetoresistive heads, and these are divided into anisotropic magnetoresistance (AMR) heads, giant magnetoresistance (GMR) heads, current perpendicular-to-plane GMR (CPP-GMR) heads, tunneling magnetoresistance (TMR) heads, and the like, according to the magnetoresistive principle used therein (see Japanese Unexamined Patent Application Publication H11-191207, for example). Input magnetic field signals which enter the read head from a magnetic recording medium are retrieved as voltage changes using AMR, GMR, CPP-GMR, and TMR, respectively.

Developments in increased density of recorded data have meant that there is currently a need for more sensitive systems for reproducing data signals. When the recording density is 500 Gb/in$^2$-2 Tb/in$^2$, TMR read heads which have a very high magnetoresistance (MR) ratio are useful because of greater sensitivity. TMR read heads employ a tunneling effect in a layered structure comprising an insulating layer and two ferromagnetic layers, one either side. One of the two ferromagnetic layers is a fixed layer in which the magnetization direction is fixed, while the other is a free layer in which the magnetization direction is changed by the external magnetic field.

TMR causes differences in the density of electrons having a different spin orientation to the orientation of the magnetization of the magnetic material and electrons having the same orientation. The resistance value of a TMR layered structure varies according to the relative angle between the magnetization direction of the fixed layer and the magnetization direction of the free layer. When the magnetization direction of the fixed layer and the magnetization direction of the free layer are parallel, the resistance is at its lowest, but when the magnetization direction of the fixed layer and the magnetization direction of the free layer are antiparallel, the resistance is at its highest. The magnetization direction of the free layer changes according to the magnetic field from the magnetization on the magnetic recording disk, and this causes the resistance value of the TMR layered structure to change. The HDD acquires the magnetization information on the magnetic recording disk by detecting this resistance value.

In one approach, it is possible to reduce the track width by increasing the recording density in the magnetic recording disk, and to reduce the size of the magnetic head accordingly. A highly sensitive TMR layered structure which may deal with a high recording density is needed in order to obtain the required reproduction output for the read head. Annealing the magnetic layers of the TMR layered structure at high temperature is effective for achieving a high MR ratio. Crystallization of the magnetic layers is promoted by the annealing treatment, and scattering of the electron spin is suppressed, whereby a high MR ratio is achieved. Magnetic heads are therefore currently produced by stacking the layers of the TMR layered structure and then carrying out high-temperature annealing.

Another effective method for increasing the MR ratio is to produce a fixed layer having high magnetization strength in one direction. It is possible to achieve large variations in magnetic resistance by means of a fixed layer having high magnetization strength in one direction and a free layer wherein the magnetization orientation varies according to the external magnetic field. The fixed layer comprises a first ferromagnetic layer, a second ferromagnetic layer, and an antiparallel coupling layer therebetween. The first ferromagnetic layer and second ferromagnetic layer generally include Co and Fe, and comprise a single layer or multiple layers. Furthermore, the antiparallel coupling layer comprises Ru. It is necessary to increase the antiparallel coupling strength between the first and second ferromagnetic layers in order to improve the strength and stability of the fixed layer.

In order to strengthen the antiparallel coupling between the first and second ferromagnetic layers, in other words to increase the antiparallel exchange coupling constant $J_{Ru}$ (erg/cm$^2$), it is effective to thin the antiparallel coupling layer. As described above, in order to promote crystallization of the magnetic layers in the TMR layered structure and increase the MR ratio, it is effective to increase the annealing temperature.

However, research carried out by the inventors revealed a problem in that the MR ratio deteriorates if the annealing temperature is raised when the antiparallel coupling layer is thin. This is believed to be due to the fact that high-temperature annealing causes increased dispersal of the ferromagnetic layers of the fixed layer in the magnetization direction, making it difficult to produce parallelism/antiparallelism. It is believed that dispersal in the magnetization direction weakens the antiparallel coupling of the first and second ferromagnetic layers, and the fixed layer shows unstable characteristics.

There is therefore a need for technology for TMR read heads which makes it possible to increase the MR ratio by promoting crystallization of the magnetic layers through high-temperature annealing, and which makes it possible to increase the coupling strength of the fixed layer. By achieving these two aims, it is possible to achieve a higher MR ratio in a TMR read head.

SUMMARY

According to one embodiment, a method for producing a Tunneling Magnetoresistance (TMR) read head includes forming a fixed layer, forming an insulating barrier layer above the fixed layer, forming a free layer above the insulating barrier layer, and annealing the free layer, the fixed layer, and the insulating barrier layer. The fixed layer includes a first ferromagnetic layer having a $Co_xFe$ ($0 \leq x \leq 15$) interface layer and a Co-based amorphous metallic layer between the $Co_xFe$ interface layer and the insulating barrier layer, an antiparallel coupling layer below the first ferromagnetic layer, and a second ferromagnetic layer below the antiparallel coupling layer.

In another embodiment, a TMR read head includes a free layer having a magnetization direction which varies according to an external magnetic field, an insulating barrier layer below the free layer, and a fixed layer below the insulating barrier layer, the fixed layer having a fixed magnetization direction. The fixed layer includes a first ferromagnetic layer having a $Co_xFe$ ($0 \leq x \leq 15$) interface layer and a Co-based amorphous metallic layer between the $Co_xFe$ interface layer and the insulating barrier layer, an antiparallel coupling layer below the first ferromagnetic layer, and a second ferromagnetic layer below the antiparallel coupling layer.

Any of these embodiments may be implemented in a magnetic data storage system such as a disk drive system, which may include a magnetic head, a drive mechanism for passing a magnetic storage medium (e.g., hard disk) over the head, and a control unit electrically coupled to the head for controlling operation of the head.

Other aspects and advantages of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein may be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

According to one general embodiment, a method for producing a Tunneling Magnetoresistance (TMR) read head includes forming a fixed layer, forming an insulating barrier layer above the fixed layer, forming a free layer above the insulating barrier layer, and annealing the free layer, the fixed layer, and the insulating barrier layer. The fixed layer includes a first ferromagnetic layer having a $Co_xFe$ ($0 \leq x \leq 15$) interface layer and a Co-based amorphous metallic layer between the $Co_xFe$ interface layer and the insulating barrier layer, an antiparallel coupling layer below the first ferromagnetic layer, and a second ferromagnetic layer below the antiparallel coupling layer.

In another general embodiment, a TMR read head includes a free layer having a magnetization direction which varies according to an external magnetic field, an insulating barrier layer below the free layer, and a fixed layer below the insulating barrier layer, the fixed layer having a fixed magnetization direction. The fixed layer includes a first ferromagnetic layer having a $Co_xFe$ ($0 \leq x \leq 15$) interface layer and a Co-based amorphous metallic layer between the $Co_xFe$ interface layer and the insulating barrier layer, an antiparallel coupling layer below the first ferromagnetic layer, and a second ferromagnetic layer below the antiparallel coupling layer.

According to one preferred embodiment, the antiparallel coupling layer may be Ru with a thickness in a range of about 3.5 Å to about 4.5 Å. When the thickness is within this range, the Ru antiparallel coupling layer may especially increase the coupling strength of the two ferromagnetic layers.

In the preferred embodiment, x is 0 in the $Co_xFe$ interface layer. This makes it possible to most effectively suppress instability of the fixed layer in the high-temperature annealing.

The annealing temperature during annealing treatment is preferably in the range of about 270° C. to about 300° C., according to one embodiment. This makes it possible to achieve a high MR ratio.

The second ferromagnetic layer in the preferred embodiment comprises a $Co_yFe$ ($0 \leq y \leq 15$) second interface layer adjacent to the antiparallel coupling layer, according to one embodiment. This makes it possible to further increase the coupling strength of the fixed layer and to achieve a higher MR ratio. Furthermore, y is preferably 0 in the $Co_yFe$ second interface layer. This makes it possible to increase the coupling strength of the fixed layer to the maximum.

In the preferred embodiment, the Co-based amorphous alloy layer includes at least one element selected from a group consisting of: Ta, Ti, Zr, Nb, Hf, W, Y, and La. This makes it possible to form a stable amorphous layer.

The TMR layered structure, according to one embodiment, comprises: a free layer in which the magnetization direction varies according to the external magnetic field, a fixed layer which is stacked on the free layer and has a fixed magnetization direction, and an insulating barrier layer between the free layer and the fixed layer. The fixed layer comprises: an antiparallel coupling layer; a first ferromagnetic layer comprising a $Co_xFe$ (0≦x≦15) interface layer adjacent to the antiparallel coupling layer and a Co-based amorphous metallic layer between the $Co_xFe$ (0≦x≦15) interface layer and the insulating barrier layer; and a second ferromagnetic layer which sandwiches the antiparallel coupling layer with the first ferromagnetic layer. It is possible to produce a read head having a high MR ratio by using this TMR layered structure.

According to one embodiment, it is possible to produce a TMR read head having a high MR ratio.

A specific mode of embodiment is described in detail below with reference to the figures. It should be noted that components which are the same bear the same reference symbols, and duplicated descriptions will be avoided for the sake of clarity. It should also be noted that the embodiments described below relate to the use of a TMR read head in the read head of a hard disk drive (HDD). The read head in this case is a tunneling magnetoresistive (TMR) read head employing a tunneling effect in a layered structure comprising an insulating layer and two ferromagnetic layers lying one either side.

The TMR read head comprises an insulating layer between a fixed layer and a free layer in the magnetoresistive sensor film thereof. The insulating barrier layer is typically formed from magnesium oxide. The method for producing the TMR read head in this embodiment is characterized by the fixed layer structure therein. The fixed layer in this embodiment comprises multiple stacked layers, including a first ferromagnetic layer, a second ferromagnetic layer, and an antiparallel coupling layer therebetween.

In the TMR read head of this embodiment, the first ferromagnetic layer is formed between the antiparallel coupling layer and the insulating barrier layer, and comprises multiple layers. When the TMR read head of this embodiment is produced, the layer in the first ferromagnetic layer forming the interface with the antiparallel coupling layer is formed from $Co_xFe$ (0≦x≦15). $Co_xFe$ means that there is x at. % of Fe and (100-x) at. % of Co. This makes it possible to suppress instability of the fixed layer in the high-temperature annealing treatment, even when a thin antiparallel coupling layer is used, and makes it possible to maintain strong coupling between the first and second ferromagnetic layers (a large antiparallel exchange coupling constant $J_{Ru}$(erg/cm$^2$) between the first and second ferromagnetic layers).

In addition, when the TMR read head of this embodiment is produced, a main ferromagnetic layer is formed between the insulating barrier layer and the $Co_xFe$ (0≦x≦15) interface layer in the first ferromagnetic layer of this embodiment. In addition, a Co-based amorphous metallic layer is formed between the main ferromagnetic layer and the $Co_xFe$ (0≦x≦15) interface layer. If the main ferromagnetic layer is in contact with the $Co_xFe$ (0≦x≦15) interface layer, crystallization occurs when the main ferromagnetic layer is formed because of the effect of the CoFe (0≦x≦15) interface layer, and it is not possible to achieve a crystallographic relationship of conformity with the insulating barrier layer, so the MR ratio drops.

By forming the Co-based amorphous metallic layer between the main ferromagnetic layer and the $Co_xFe$ (0≦x≦15) interface layer, it is possible to make the main ferromagnetic layer amorphous when the main ferromagnetic layer is formed, and suitable crystallization of the main ferromagnetic layer may be promoted in the subsequent high-temperature annealing treatment; a crystallographic relationship of conformity with the insulating barrier layer may also be achieved, and a high MR ratio can be achieved.

When the TMR read head of this embodiment is produced in such a way, the strong coupling of the fixed layer can be maintained, even with high-temperature annealing, by forming the $Co_xFe$ (0≦x≦15) interface layer, which is adjacent to the antiparallel coupling layer, in the first ferromagnetic layer. In addition, by forming the Co-based amorphous metallic layer between the $Co_xFe$ (0≦x≦15) interface layer and the main ferromagnetic layer, it is possible to prevent any impediment to suitable crystallization of the main ferromagnetic layer in the high-temperature annealing treatment. This makes it possible to realize a high MR ratio for the TMR read head.

Figure 1:
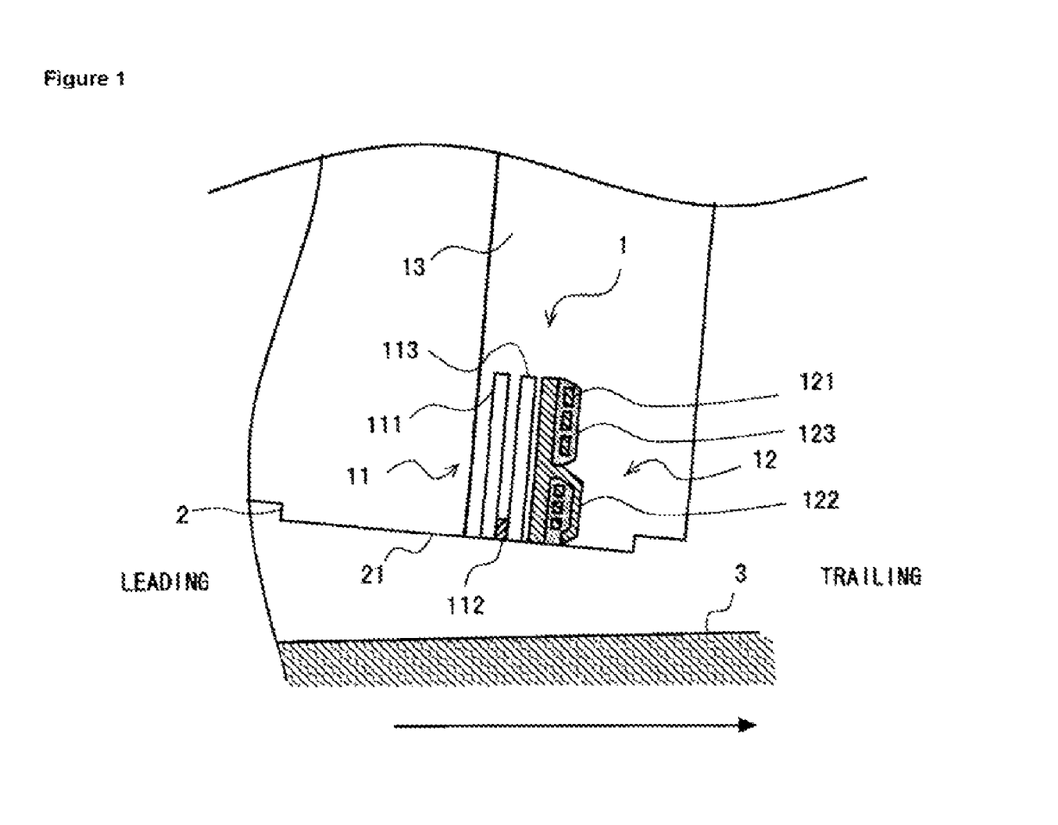
FIG. 1 is a view in cross section schematically showing the structure of a magnetic head according to one embodiment.

Before a more specific description is given with regard to the TMR layered structure of the TMR read head of this embodiment, the overall configuration of the magnetic head will be described first of all. FIG. 1 is a view in cross section schematically showing the structure of a magnetic head 1. The magnetic head 1 reads and writes magnetic data in conjunction with a magnetic disk 3. The magnetic head 1 has a read head 11 and a write head 12 from the side of the direction of travel thereof (the leading side). The magnetic head 1 is formed on the trailing side of a slider 2 (the opposite side to the leading side). The read head 11 comprises, from the leading side, a lower shield 111, a magnetoresistive sensor 112, and an upper shield 113.

The write head 12 comprises a thin film coil 121 and a recording pole 122. The thin film coil 12.1 is surrounded by an insulator 123. The write head 12 is an inductive element which generates a magnetic field with the recording pole 122 by means of current which flows through the thin film coil 121, and records magnetic data onto the magnetic disk 3. The read head 11 is a magnetoresistive element which is provided with the magnetoresistive sensor 112 having magnetic anisotropy, and reads out magnetic data recorded on the magnetic disk 3 using resistance values which vary according to the magnetic field from the magnetic disk 3. The read head in this embodiment is a TMR read head, and the lower shield 111 and upper shield 113 are employed as electrodes for supplying sense current to the magnetoresistive sensor 112.

The magnetic head 1 is formed using a thin film formation process on an AlTiC substrate which constitutes the slider 2. The magnetic head 1 and the slider 2 constitute a head-slider. The head-slider floats above the magnetic disk 3, and the magnetic disk facing surface 21 thereof is referred to as the air bearing surface (ABS). The magnetic head 1 is provided with a protective film 13 such as an alumina film at the periphery of the write head 12 and the read head 11, and the whole of the magnetic head 1 is protected by this protective film 13.

Figure 2:
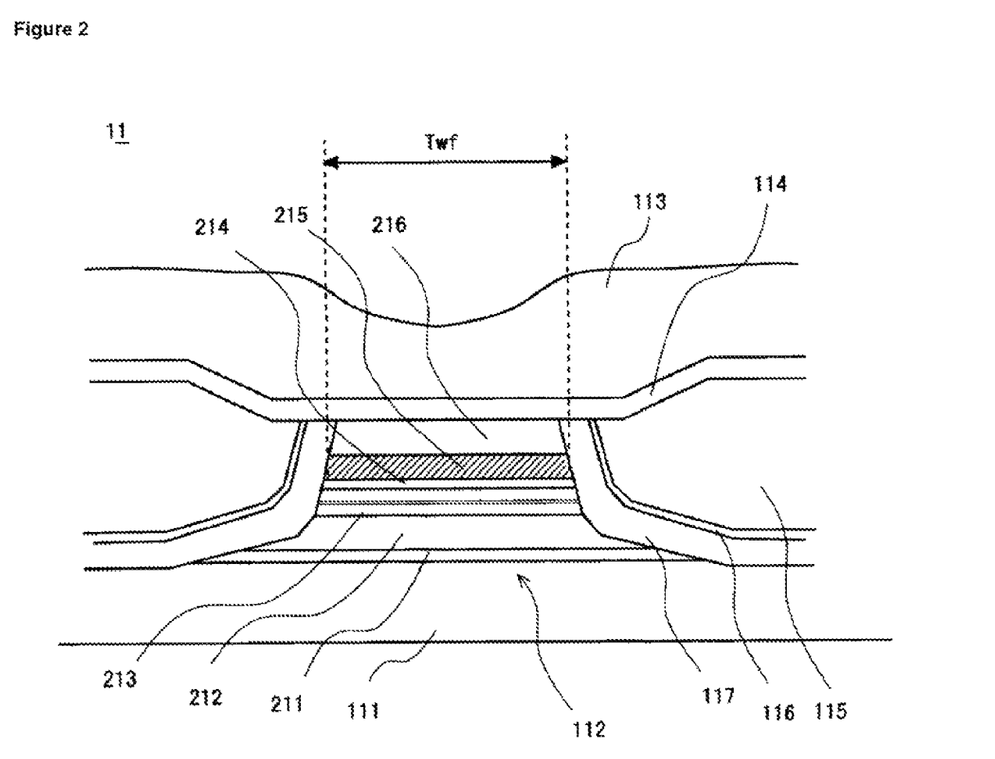
FIG. 2 is a view in cross section schematically showing one example of the structure of a TMR read head in which a magnetoresistive sensor structure may be employed according to one embodiment.

FIG. 2 is a view in cross section schematically showing one example of the structure/configuration of the TMR read head 11 in which the magnetoresistive sensor structure according to this embodiment can be employed. FIG. 2 schematically shows the cross-sectional structure seen from the side of the ABS 21 of the head-slider. The lower side in FIG. 2 is the leading side, and the upper side is the trailing side. In the present specification, the AlTiC substrate side where the TMR read head 11 is formed, i.e. the slider 2 side, constitutes the lower side, and the trailing side which is opposite constitutes the upper side. Each layer of the read head 11 is formed in succession from the lower side.

The magnetoresistive sensor 112 is a multilayer film comprising a number of layers, and lies between the lower shield 111 and the upper shield 113. The lower shield 111 and upper shield 113 serve as magnetic shields, while also serving as upper and lower electrodes for supplying sense current to the magnetoresistive element 112. It should be noted that an upper magnetic separating film 114 comprising a conductor is formed below the upper shield 113.

The magnetoresistive sensor 112 comprises, stacked in succession from the lower layer side: a sensor underlayer 211; an antiferromagnetic layer 212; a fixed layer 213; an insulating barrier layer 214; a free layer 215; and a sensor cap layer 216. Each layer is in physical contact with adjacent layers. The sensor underlayer 211 has a layered structure comprising a Ta/Ru, Ta/NiFeCr alloy etc., and is formed from materials which improve the crystallinity of the multiple layers formed thereon.

Exchange interaction with the antiferromagnetic layer 212 acts on the fixed layer 213, and the magnetization direction thereof is fixed. The track width of the free layer 215 is represented by Twf. The TMR read head operates by using variations in resistance caused by relative changes in the magnetization direction of the free layer 215 with respect to the magnetization direction of the fixed layer 213. That is to say, if the magnetization direction of the free layer 215 changes with respect to the magnetization direction of the fixed layer 213 due to the data magnetic field from the magnetic disk, the resistance value (current value) of the magnetoresistive sensor 112 changes. The read head 11 is able to detect the narrowed external data magnetic field by detecting the resistance value (current value) of the magnetoresistive sensor 112.

A hard bias film 115 is present on both the left and right sides of the magnetoresistive sensor element 112 in order to suppress Barkhausen noise caused by non-uniformity in the magnetic domain of the free layer 215. The hard bias film 115 is typically formed from Co alloy, such as CoCrPt alloy or CoPt alloy, or the like. The bias magnetic field from the hard bias film 115 is applied to the free layer 215, and acts in such a way as to produce a single magnetic domain in the free layer 215, thereby stabilizing the magnetization action in the free layer. The hard bias film 115 is formed on a hard bias base film 116. A junction insulating film 117 is formed as an underlayer for the hard bias base film 116. The insulating film 117 is formed from alumina, for example. It should be noted that the magnetoresistive sensor in this embodiment may be employed in a read head having another hard bias film structure.

Figure 3:
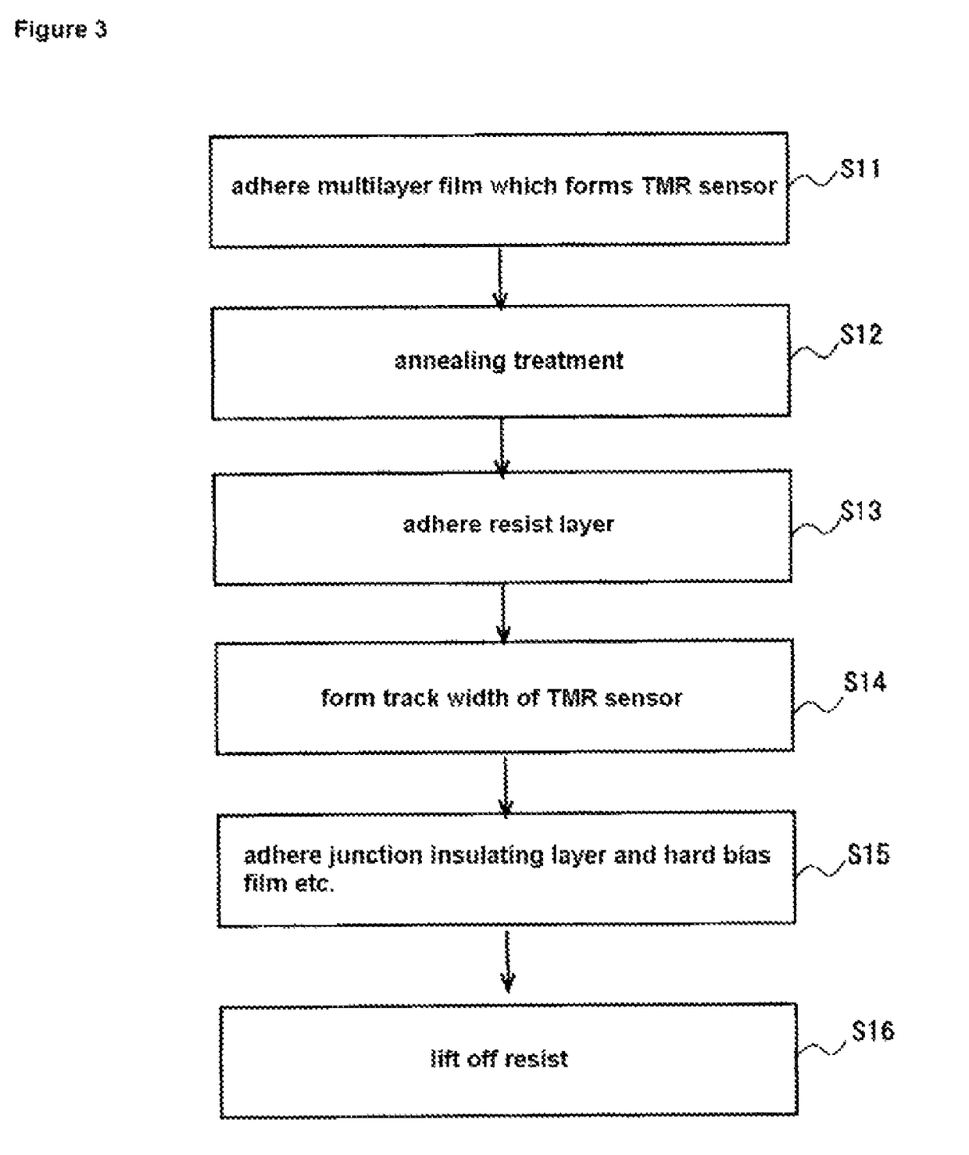
FIG. 3 is a flowchart showing the production flow for the TMR read head according to one embodiment.

The flow for producing the TMR read head 11 will be described with reference to the flowchart in FIG. 3. The multilayer film which forms the TMR sensor 112 is adhered by means of sputtering S11. After the multilayer film has been formed, high-temperature annealing is carried out S12. This promotes crystallization of the TMR sensor 112. The annealing temperature in the annealing treatment S12 is preferably about 270° C. to about 300° C., according to one embodiment. The high annealing temperature makes it possible to effectively promote crystallization of the first ferromagnetic layer, insulating barrier layer, and second ferromagnetic layer, but an excessively high annealing temperature causes a deterioration in the antiparallel state of the first and second ferromagnetic layers, and there is a deterioration in the MR ratio because of the variation in the magnetization direction oldie second ferromagnetic layer. The annealing time is typically several hours.

The resist layer is formed by resist application and patterning S13. The track width of the TMR sensor 112 is formed by means of etching employing ion beam etching (ion milling) (S14). Etching is thereby carried out from the sensor cap layer 216 to the sensor underlayer 211.

After this, the junction insulating layer 117, hard bias base film 116, and hard bias film 115 are adhered S15. The junction insulating film 117 and the hard bias film 115 are formed by means of ion beam deposition (IBD), for example. After this, the resist on the TMR sensor 112 is removed by lift-off S16.

Figure 4:
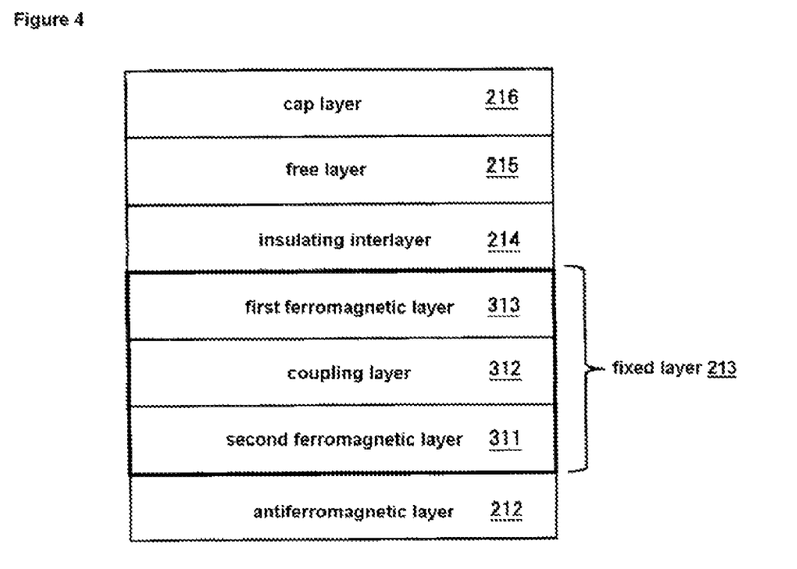
FIG. 4 schematically shows the layered structure of the magnetoresistive sensor element in a TMR read head according to one embodiment.

FIG. 4 schematically shows the layered structure of the magnetoresistive sensor element 112 in the TMR read head of this embodiment. The TMR sensor 112 comprises, from the lower layer side: the antiferromagnetic layer 212; fixed layer 213; insulating barrier layer 214; free layer 215; and sensor cap layer 216. It should be noted that the layers may be stacked in the opposite order, excluding the cap layer 216.

The fixed layer 213 is a multilayered fixed layer. It comprises two ferromagnetic layers, namely a first ferromagnetic layer 313 and a second ferromagnetic layer 311, and an antiparallel coupling layer 312 therebetween. Exchange interaction with the antiferromagnetic layer 212 acts on the second ferromagnetic layer 311 on the lower layer side (outer side), and the magnetization direction is fixed. The first ferromagnetic layer 313 and the second ferromagnetic layer 311 are coupled in an antiparallel fashion by the exchange interaction, and the magnetization directions thereof are stabilized so as to be antiparallel.

Figure 5:
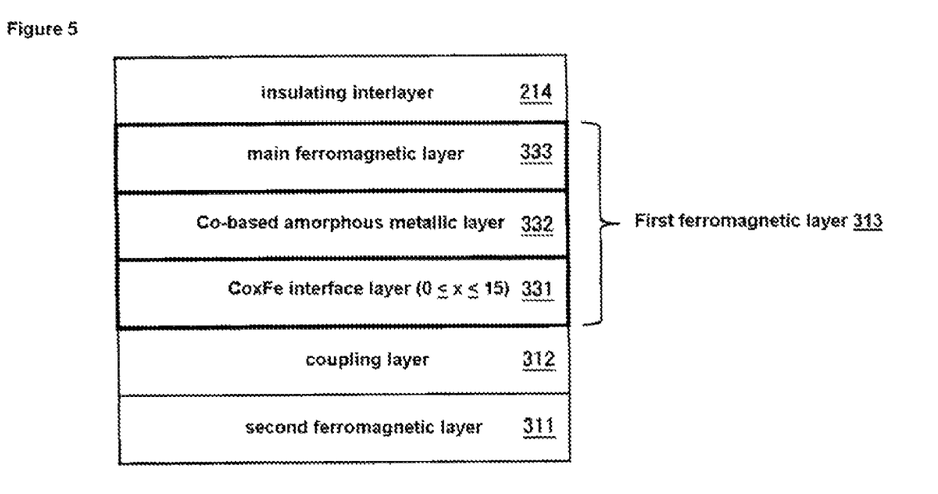
FIG. 5 schematically shows the layered structure of the first ferromagnetic layer in the fixed layer according to one embodiment.

FIG. 5 schematically shows the layered structure of the first ferromagnetic layer 313 in the fixed layer 213 in this mode of embodiment. This layered structure is the structure before the annealing treatment S12, after film formation when the TMR read head 11 is produced. Each layer is adhered in succession from the lower side when the TMR read head 11 is produced. In this specification, the structure before the annealing treatment is also referred to as a TMR sensor (layered structure) or a TMR read head.

As shown in FIG. 5, the first ferromagnetic layer 313 is a layered structure formed from a number of layers. Specifically, the first ferromagnetic layer 313 comprises, in succession from the lower layer side: a $Co_xFe$ ($0 \leq x \leq 15$) interface layer 331; a Co-based amorphous metallic layer 332; and a main ferromagnetic layer 333. The $Co_xFe$ interface layer 331 comprises about 0 at. % to about 15 at. % Fe and about 85 at. % to about 100 at. % Co. This $Co_xFe$ interface layer 331 makes it possible to suppress instability in the fixed layer 213 during the high-temperature annealing.

The $Co_xFe$ interface layer 331 is adjacent to the antiparallel coupling layer 312 and is in contact with the antiparallel coupling layer 312 so that an interface is formed therebetween. The main ferromagnetic layer 333 may comprise a single layer or a number of layers. The first ferromagnetic layer 313 has the function of a reference layer for the magnetization direction of the free layer 215. That is to say, the resistance value changes according to the relative angle between the magnetization direction of the first ferromagnetic layer 313 and the magnetization direction of the free layer 215.

Furthermore, the relationship of conformity between the main ferromagnetic layer 333 and the insulating barrier layer 214 enables expressing changes in magnetic resistance. Heat treatment causes the main ferromagnetic layer 333 to change from an amorphous state to a crystalline state, and this process produces a crystallographic relationship of conformity with the insulating barrier layer 214. The main ferromagnetic layer 333 produces electron spin polarization and plays a role in expressing magnetic resistance changes.

The Co-based amorphous metallic layer 332 is formed between the main ferromagnetic layer 333 and the $Co_xFe$ interface layer 331. The Co-based amorphous metallic layer 332 preferably includes one or more elements selected from a group consisting of: Ta, Ti, Zr, Nb, Hf, W, Y, and La, according to one embodiment. These elements form a stable amorphous layer because there is a large difference in atomic radius with Co and they are immiscible. For example, one preferred Co-based amorphous metallic layer 332 is a CoHf layer comprising 20-30 at. % Hf.

The $Co_xFe$ ($0 \leq x \leq 15$) interface layer 331 is crystalline prior to the annealing treatment. By forming the Co-based amorphous metallic layer 332 between the $Co_xFe$ ($0 \leq x \leq 15$) interface layer 331 and the main ferromagnetic layer 333, the main ferromagnetic layer 333 prior to the annealing treatment can be formed as an amorphous metal, and the main ferromagnetic layer 333 becomes crystalline due to the annealing treatment after the film formation so that there is a crystallographic relationship of conformity with the insulating barrier layer 213, and it is possible to achieve a high MR ratio.

Figure 6A:
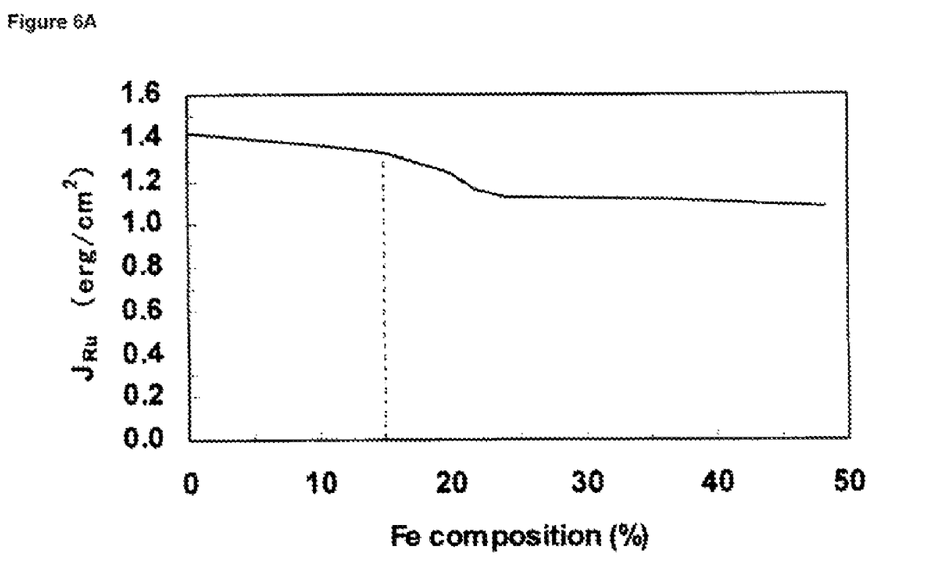
FIG. 6A is measurement data showing the relationship between the proportion of Fe in the $Co_xFe$ ($0 \leq x \leq 15$) interface layer and the antiparallel exchange coupling constant $J_{Ru}$ ($erg/cm^2$) according to one embodiment.
Figure 6B:
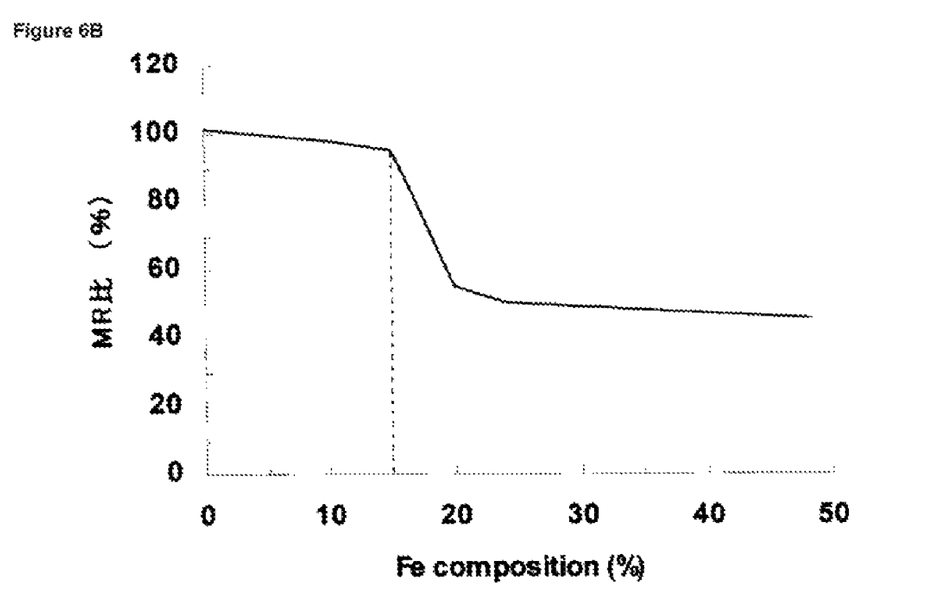
FIG. 6B is measurement data showing the relationship between the proportion of Fe in the $Co_xFe$ ($0 \leq x \leq 15$) interface layer and the MR ratio (%) according to one embodiment.

The smaller the proportion of Fe in the $Co_xFe$ ($0 \leq x \leq 15$) interface layer 331, the better. This means that a preferred interface layer 331 may include of Co, according to one embodiment. FIG. 6A is measurement data showing the relationship between the proportion of Fe in the $Co_xFe$ ($0 \leq x \leq 15$) interface layer 331 and the antiparallel exchange coupling constant $J_{Ru}$(erg/cm$^2$). Furthermore, FIG. 6B is measurement data showing the relationship between the proportion of Fe in the $Co_xFe$ ($0 \leq x \leq 15$) interface layer 331 and the MR ratio (%). The elements used in the measurements comprised an Ru antiparallel coupling layer between the CoFe alloy layer and the $Co_xFe$ layer; for the measurements, a plurality of elements having different proportions x of Fe in the $Co_xFe$ layer were prepared, and the antiparallel exchange coupling constant $J_{Ru}$ and the MR ratio (%) were measured for each.

As shown in the two graphs in FIGS. 6A and 6B, when the proportion of Fe exceeds 15 at. %, the antiparallel exchange coupling constant $J_{Ru}$, and the MR ratio decrease sharply. When the Fe is in a range no greater than 15 at. %, the antiparallel exchange coupling constant $J_{Ru}$ and the MR ratio steadily decrease as the proportion of Fe increases. As supported by these measurement results, the proportion of Fe in the $Co_xFe$ interface layer 331 is preferably below about 15 at. %, according to one embodiment.

If the $Co_{Fe}$ ($0 \leq x \leq 15$) interface layer 331 is too thick, the characteristics of the TMR sensor 112 are impaired. This means that it is preferably formed to be thin, in a thickness range which makes it possible to achieve the required coupling strength in the fixed layer. The thickness of the $Co_xFe$ ($0 \leq x \leq 15$) interface layer 331 is preferably about 3 to about 10Å, according to one embodiment.

Figure 7:
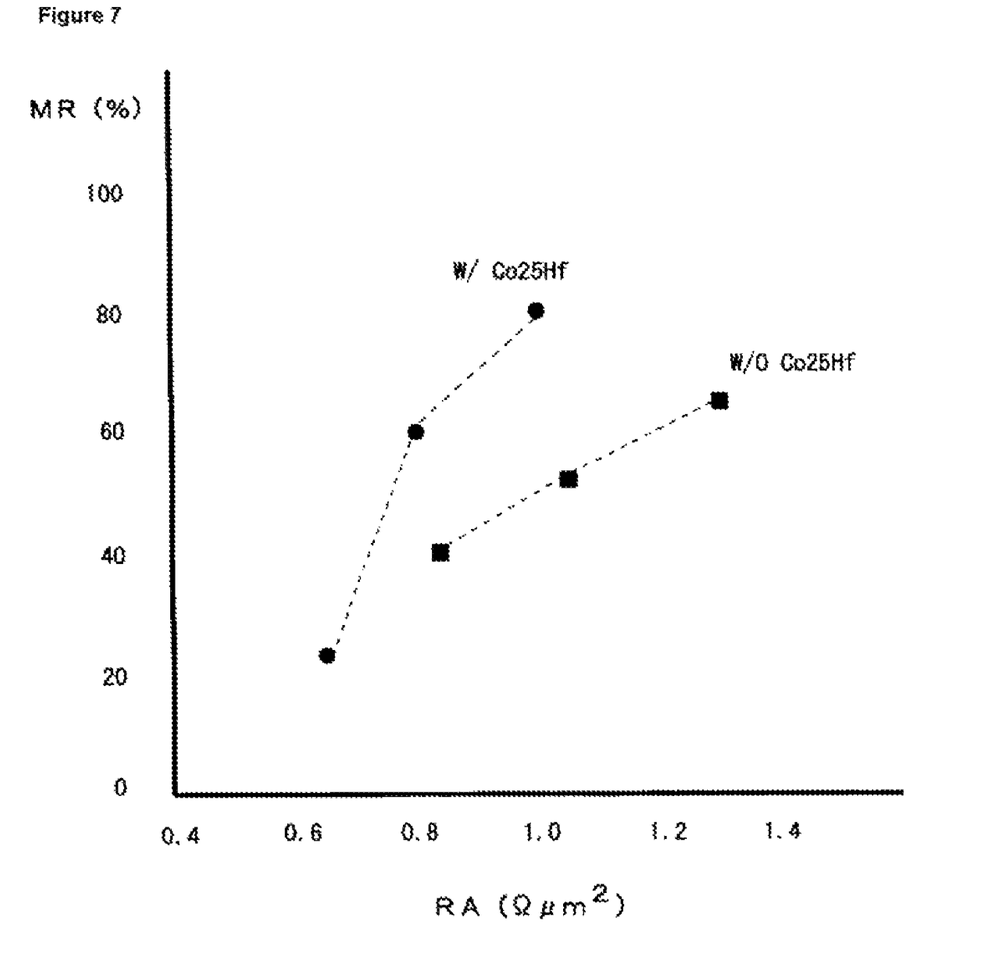
FIG. 7 is measurement data showing the effect of the Co-based amorphous metallic layer according to one embodiment.

FIG. 7 is measurement data showing the effect of the Co-based amorphous metallic layer. For the measurements, TMR read heads comprising a Co-based amorphous metallic layer and TMR read heads not comprising said layer were prepared, and the area resistance RA ($\Omega\mu m^2$) and MR ratio (%) of each sample were measured. The TMR sensors of the TMR read heads comprising the Co-based amorphous metallic layer used in the measurements had the layered structure shown in FIG. 10 prior to the annealing treatment. The TMR sensors of the TMR read heads not comprising the Co-based amorphous metallic layer had a structure in which the Co25Hf layer 332 constituting the Co-based amorphous metallic layer was excluded from the layered structure shown in FIG. 10 prior to the annealing treatment.

As shown in the measurement data in FIG. 7, the samples having the $Co_{25}Hf$ layer had a higher MR ratio than the samples without, for the same area resistance. These measurements clearly showed that it is possible to increase the MR ratio in a TMR read head by forming the Co-based amorphous metallic layer in the first ferromagnetic layer of the fixed layer, according to one embodiment.

Figure 8:
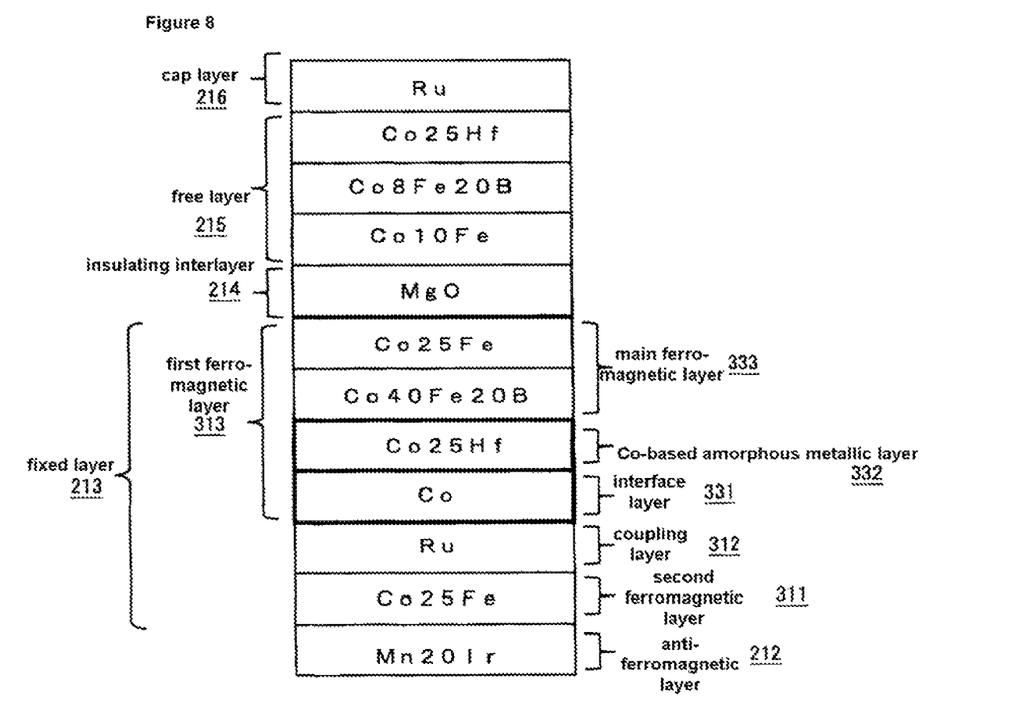
FIG. 8 schematically shows an example of a preferred layered structure for TMR according to one embodiment.

FIG. 8 schematically shows an example of a preferred layered structure for the TMR sensor 112 according to one embodiment. The numerical values for each layer are examples of film thickness. The structure of the TMR sensor 112 shown in FIG. 8 is the structure prior to the annealing treatment. As shown in FIG. 8, the sensor cap layer 216 is formed from Ru, for example. The sensor cap layer 216 is a single-layer or comprises several layers. The free layer 215 is preferably a ferromagnetic structure which comprises several layers and includes Co and Fe, according to one embodiment. In the free layer 215, the $Co_8Fe_{20}B$ is an alloy layer comprising about 72 at. % Co, about 8 at. % Fe and about 20 at. % B, according to one embodiment.

The insulating barrier layer 214 is preferably formed from magnesium oxide MgO. The anti ferromagnetic layer 212 is formed from an anti ferromagnetic material such as PtMn or MnIr. The example shown in FIG. 7 is an anti ferromagnetic layer 212 comprising $Mn_{20}Ir$. In this layer, there is about 80 at. % Mn and about 20 at. % Ir. in the present embodiment, the configuration of the sensor cap layer 216, free layer 215, insulating barrier layer 214 and anti ferromagnetic layer 212 is not limited to that described above, and it may comprise other materials or structures.

In the exemplary structure shown in FIG. 8, the main ferromagnetic layer 333 in the first ferromagnetic layer has a two-layer structure comprising a $Co_{40}Fe_{20}B$ lower layer and a $Co_{25}Fe$ upper layer. The $Co_{40}Fe_{20}B$ layer is adjacent to the Co-based amorphous metallic layer 332 and in contact therewith. The $Co_{40}Fe_{20}B$ layer is generally thicker than the $Co_{25}Fe$ layer. The main ferromagnetic layer 333 preferably comprises a cobalt-iron alloy layer comprising 4-30 at. % B in order to demonstrate a high MR ratio.

The inclusion of at least 4 at. % B in the main ferromagnetic layer 333 promotes the amorphization of the main ferromagnetic layer 333 which is formed on the Co-based amorphous metallic layer 332, and when this layer includes no more than 30 at. % B, crystallinity is achieved in the annealed main ferromagnetic layer 333, which is preferable. The main ferromagnetic layer 333 may equally comprise a $Co_{40}Fe_{20}B$ layer. Another layer may also be formed between the $Co_{25}Fe$ layer and the insulating barrier layer 214.

In FIG. 8, the $Co_{25}Hf$ layer is shown as a preferred example of the Co-based amorphous metallic layer 332. The thickness of the Co-based amorphous metallic layer 332 is preferably about 5 A to about 20 A, according to one embodiment. In FIG. 7, the Co layer 331 is shown as a preferred example of the $Co_xFe$ ($0 \leq x \leq 15$) interface layer 331 which is in contact with the antiparallel coupling layer 312. As described above, the Co layer is the most preferred interface layer 331.

The antiparallel coupling layer 312 preferably comprises Ru. Ru is a material which makes it possible to achieve strong antiparallel coupling with the two ferromagnetic layers either side. In order to strengthen the coupling of the two ferromagnetic layers, it is effective to make the Ru antiparallel coupling layer 312 thinner. If the Ru antiparallel coupling layer 312 is excessively thin, the coupling strength with the two ferromagnetic layers will on the contrary be reduced. The thickness of the Ru antiparallel coupling layer 312 is therefore preferably in the range of about 3.5 Å to about 4.5 Å, according to one embodiment. When the thickness is within this range, the coupling strength of the Ru antiparallel coupling layer 312 with the two ferromagnetic layers can be especially increased.

In the exemplary structure shown in FIG. 8, the second ferromagnetic layer 311 comprises $Co_{25}Fe$. Cobalt-iron alloy is highly magnetized and is a preferred material for the ferromagnetic layers in the fixed layer. The second ferromagnetic layer 311 may equally comprise cobalt-iron alloy having a different compositional ratio, or ferromagnetic metals which are different elements.

Figure 9:
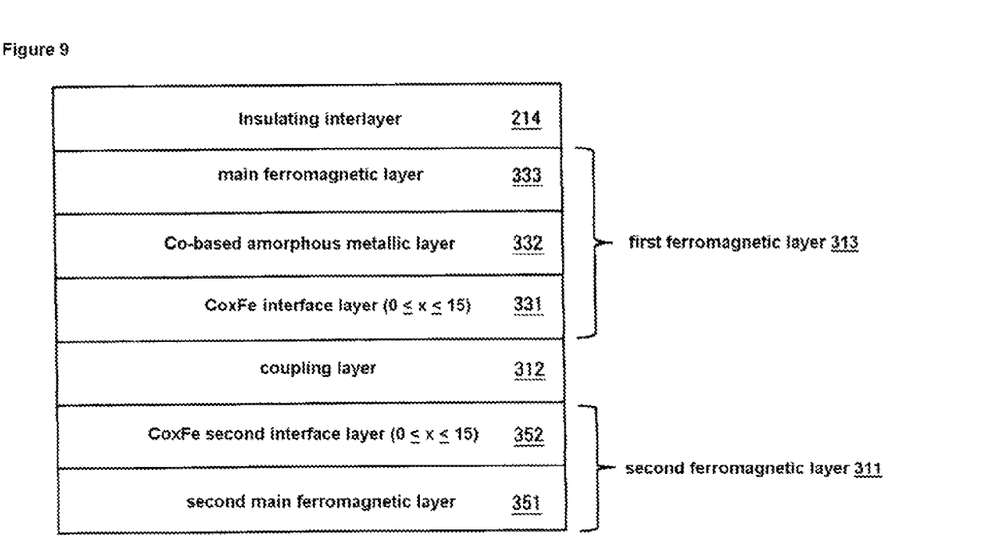
FIG. 9 schematically shows a more preferred structure for TMR according to one embodiment.

FIG. 9 schematically shows one preferred layer structure for the TMR sensor 112, according to one embodiment. With this structure, in addition to the first ferromagnetic layer 313 in the fixed layer 213, the second ferromagnetic layer 311 also comprises a second $Co_xFe$ ($0 \leq y \leq 15$) interface layer 352. Both the first ferromagnetic layer 313 and the second ferromagnetic layer 311 comprise a CoFe interface layer adjacent to the antiparallel coupling layer 312 (forming an interface therewith), and therefore the coupling strength of the fixed layer 213 can be further increased (a reduction in the coupling strength caused by the annealing treatment can be effectively suppressed), and a higher MR ratio can be achieved.

The same description as for the $Co_xFe$ interface layer 331 in the first ferromagnetic layer 313 can be applied to the $Co_yFe$ second interface layer 352 in the second ferromagnetic layer 311. In a preferred structure, the $Co_yFe$ second interface layer 352 is therefore a Co layer of thickness from about 3 Å to about 10 Å, according to one embodiment.

The second ferromagnetic layer 311 comprises a second main ferromagnetic layer 351 under the second $Co_yFe$ interface layer 352. The second main ferromagnetic layer 351 is a ferromagnetic layer which determines the magnetization of the second ferromagnetic layer 311. The second ferromagnetic layer 311 may be different from the first ferromagnetic layer 313 and need not comprise a Co-based amorphous alloy layer, but may be comprised of any suitable material known to a person having ordinary skill in the art.

According to one embodiment, x in the first interface layer may be equal or about equal to y in the second interface layer.

Figure 10:
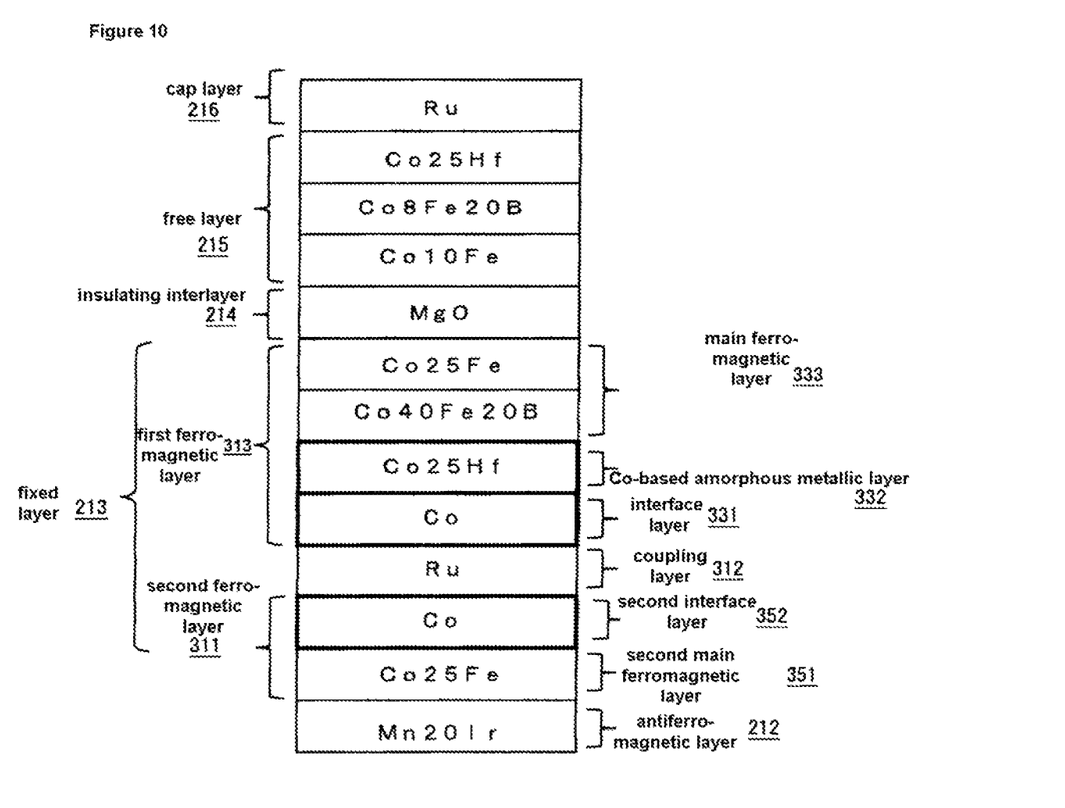
FIG. 10 schematically shows an example of a more preferred layered structure for TMR according to one embodiment.

FIG. 10 schematically shows an example of a more preferred TMR sensor 112 according to the present embodiment. This exemplary structure comprises a second interface layer 352 formed from Co in the second ferromagnetic layer 311 of the fixed layer 213. The Co second interface layer 352 is adjacent to and in contact with the Ru antiparallel coupling layer 312, and forms an interface therewith. In this way it is possible to further increase the coupling strength in the fixed layer 213 by virtue of the fact that the second ferromagnetic layer 311 comprises the second interface layer 352 between the Ru antiparallel coupling layer 312 and the second main ferromagnetic layer 351. $Co_{25}Fe$, which is an example of a cobalt-iron alloy, is given as a preferred example of the second main ferromagnetic layer 351. The rest of the structure is the same as the exemplary structure shown in FIG. 7.

A preferred exemplary embodiment has been described above, but the present invention is not limited to this embodiment alone. A person skilled in the art will easily be able to make changes, additions and substitutions to the components of the embodiment described above within the scope of the present invention.

Figure 11:
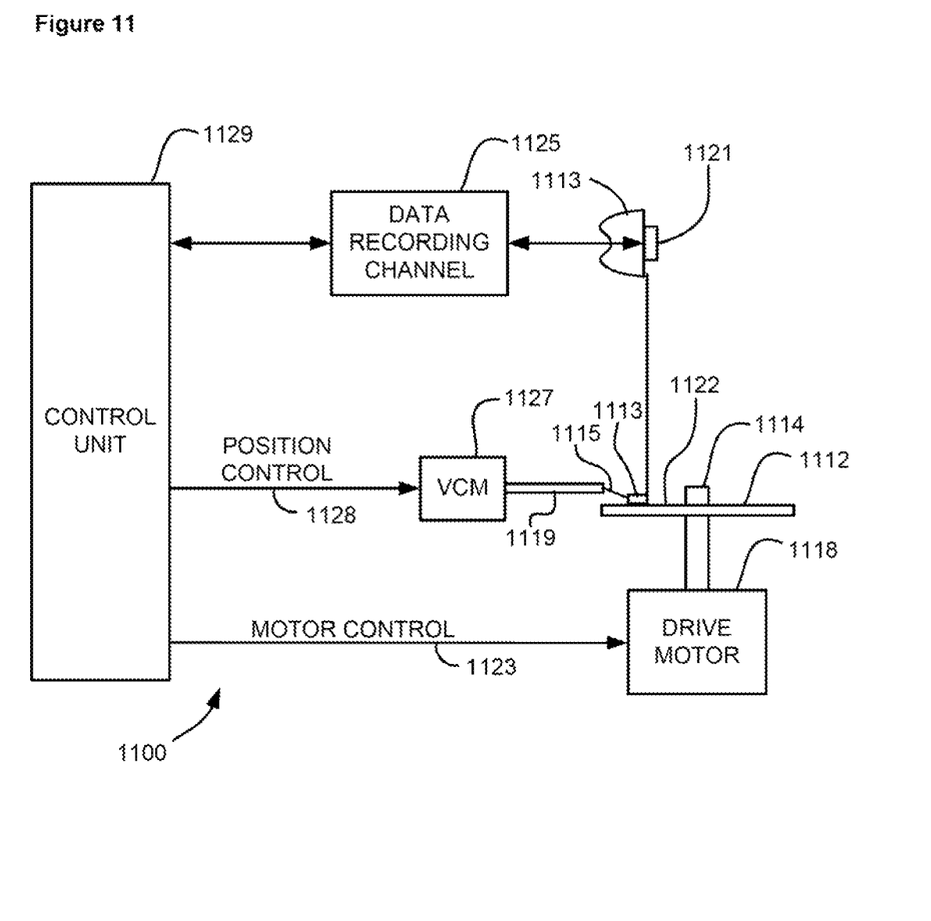
FIG. 11 is a simplified drawing of a magnetic recording disk drive system, according to one embodiment.

Referring now to FIG. 11, there is shown a disk drive 1100 in accordance with one embodiment of the present invention. As shown in FIG. 11, at least one rotatable magnetic disk 1112 is supported on a spindle 1114 and rotated by a disk drive motor 1118. The magnetic recording on each disk is typically in the form of an annular pattern of concentric data tracks (not shown) on the disk 1112.

At least one slider 1113 is positioned near the disk 1112, each slider 1113 supporting one or more magnetic read/write heads 1121. As the disk rotates, slider 1113 is moved radially in and out over disk surface 1122 so that heads 1121 may access different tracks of the disk where desired data are recorded and/or to be written. Each slider 1113 is attached to an actuator arm 1119 using a suspension 1115. The suspension 1115 provides a slight spring force which biases slider 1113 against the disk surface 1122. Each actuator aim 1119 is attached to an actuator 1127. The actuator 1127 as shown in FIG. 11 may be a voice coil motor (VCM). The VCM comprises a coil movable within a fixed magnetic field, the direction and speed of the coil movements being controlled by the motor current signals supplied by controller 1129.

During operation of the disk storage system, the rotation of disk 1112 generates an air bearing between slider 1113 and disk surface 1122 which exerts an upward force or lift on the slider. The air bearing thus counter-balances the slight spring force of suspension 115 and supports slider 1113 off and slightly above the disk surface by a small, substantially constant spacing during normal operation. Note that in some embodiments, the slider 1113 may slide along the disk surface 1122.

The various components of the disk storage system are controlled in operation by control signals generated by control unit 1129, such as access control signals and internal clock signals. Typically, control unit 1129 comprises logic control circuits, storage (e.g., memory), and a microprocessor. The control unit 1129 generates control signals to control various system operations such as drive motor control signals on line 1123 and head position and seek control signals on line 1128. The control signals on line 1128 provide the desired current profiles to optimally move and position slider 1113 to the desired data track on disk 1112. Read and write signals are communicated to and from read/write heads 1121 by way of recording channel 1125.

The above description of a typical magnetic disk storage system, and the accompanying illustration of FIG. 11 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In one embodiment, a magnetic data storage system 1100 may include at least one TMR read head 1121 as described according to any embodiments herein, a magnetic recording medium 1122, a drive mechanism 1118 for passing the magnetic medium 1122 over the at least one TMR read head 1121, and a controller 1129 electrically coupled to the at least one TMR read head 1121 for controlling operation of the at least one TMR read head 1121.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method for producing a TMR read head, the method comprising:
   forming a fixed layer;
   forming an insulating barrier layer above the fixed layer;
   forming a free layer above the insulating barrier layer; and
   annealing the free layer, the fixed layer, and the insulating barrier layer,
   wherein the fixed layer comprises:
   a first ferromagnetic layer, the first ferromagnetic layer comprising:
   a $Co_xFe$ ($0 \leq x \leq 15$) interface layer; and
   a Co-based amorphous metallic layer between the $Co_xFe$ interface layer and the insulating barrier layer;

an antiparallel coupling layer below the first ferromagnetic layer; and a second ferromagnetic layer below the antiparallel coupling layer.

2. The method according to claim 1, wherein the antiparallel coupling layer comprises Ru, and wherein the antiparallel coupling layer has a thickness in a range from about 3.5 Å to about 4.5 Å.

3. The method according to claim 1, wherein x is 0 in the $Co_xFe$ interface layer.

4. The method according to claim 1, wherein annealing the free layer, the fixed layer, and the insulating barrier layer is performed at an annealing temperature in a range from about 270° C. to about 300° C.

5. The method according to claim 1, wherein the Co-based amorphous alloy layer comprises. at least one element selected from a group consisting of: Ta, Ti, Zr, Nb, Hf, W, Y, and La.

6. The method according to claim 1, wherein the second ferromagnetic layer comprises a $Co_xFe$ ($0 \leq y \leq 15$) second interface layer adjacent to the antiparallel coupling layer.

7. The method according to claim 6, wherein y is 0 in the $Co_xFe$ second interface layer.

8. A Tunneling Magnetoresistive (TMR) read head, the TMR read head comprising:

a free layer having a magnetization direction which varies according to an external magnetic field;

an insulating barrier layer below the free layer; and a fixed layer below the insulating barrier layer, the fixed layer having a fixed magnetization direction, wherein the fixed layer comprises:

a first ferromagnetic layer, the first ferromagnetic layer comprising:

a $Co_xFe$ ($0 \leq x \leq 15$) interface layer; and a Co-based amorphous metallic layer between the $Co_xFe$ interface layer and the insulating barrier layer;

an antiparallel coupling layer below the first ferromagnetic layer; and a second ferromagnetic layer below the antiparallel coupling layer.

9. The TMR read head according to claim 8, wherein the antiparallel coupling layer comprises Ru, and wherein the antiparallel coupling layer has a thickness in a range from about 3.5 Å to about 4.5 Å.

10. The TMR read head according to claim 8, wherein x is 0 in the $Co_xFe$ interface layer.

11. The TMR read head according to claim 8, wherein the second ferromagnetic layer comprises a $Co_xFe$ ($0 \leq y \leq 15$) second interface layer adjacent to the antiparallel coupling layer.

12. The TMR read head according to claim 11, wherein y is 0 in the $Co_xFe$ second interface layer.

13. The TMR read head according to claim 8, wherein the Co-based amorphous alloy layer comprises at least one element selected from a group consisting of: Ta, Ti, Zr, Nb, Hf, W, Y, and La.

14. A magnetic data storage system, comprising:

at least one TMR read head as recited in claim 8;

a magnetic recording medium;

a drive mechanism for passing the magnetic medium over the at least one TMR read head; and a controller electrically coupled to the at least one TMR read head for controlling operation of the at least one TMR read head.

* * * * *

UNITED STATES PATENT AND TRADEMARK OFFICE
CERTIFICATE OF CORRECTION

PATENT NO. : 8,351,163 B2
APPLICATION NO. : 12/948072
DATED : January 8, 2013
INVENTOR(S) : Sakamoto et al.

It is certified that error appears in the above-identified patent and that said Letters Patent is hereby corrected as shown below:

In the specification:

col. 6, line 26 replace "12.1" with --121--;

col. 7, line 56 replace "oldie" with --of the--;

col. 10, line 42 replace "5 A to about 20 A," with --5 Å to about 20 Å,--;

col. 11, line 66 replace "aim" with --arm--;

In the Claims:

col. 13, line 17 replace "IIf," with --Hf,--.

Signed and Sealed this
Fourteenth Day of May, 2013

Teresa Stanek Rea
*Acting Director of the United States Patent and Trademark Office*